United States Patent

Copner

(10) Patent No.: US 9,831,458 B2
(45) Date of Patent: Nov. 28, 2017

(54) ORGANIC LIGHT EMITTING DIODE STRUCTURE

(71) Applicant: LOMOX LIMITED, Cheshire (GB)

(72) Inventor: Nigel Joseph Copner, Gwent (GB)

(73) Assignee: Lomox Limited (GB)

( * ) Notice: Subject to any disclaimer, the term of this patent is extended or adjusted under 35 U.S.C. 154(b) by 0 days.

(21) Appl. No.: 14/894,667

(22) PCT Filed: May 28, 2014

(86) PCT No.: PCT/GB2014/051618
§ 371 (c)(1),
(2) Date: Nov. 30, 2015

(87) PCT Pub. No.: WO2014/191733
PCT Pub. Date: Dec. 4, 2014

(65) Prior Publication Data
US 2016/0126488 A1 May 5, 2016

(30) Foreign Application Priority Data

May 29, 2013 (GB) .................................. 1309601.1

(51) Int. Cl.
*H01L 51/52* (2006.01)
(52) U.S. Cl.
CPC ...... *H01L 51/5209* (2013.01); *H01L 51/5218* (2013.01); *H01L 51/5265* (2013.01)
(58) Field of Classification Search
CPC combination set(s) only.
See application file for complete search history.

(56) References Cited

U.S. PATENT DOCUMENTS

| 2004/0012328 A1* | 1/2004 | Arnold | H01L 51/529 313/504 |
| 2005/0088084 A1* | 4/2005 | Cok | H01L 51/5281 313/506 |
| 2005/0269578 A1* | 12/2005 | Barnes | H01L 51/5253 257/81 |

(Continued)

FOREIGN PATENT DOCUMENTS

| WO | 20090064019 | 5/2009 |
| WO | 20090064021 | 5/2009 |

OTHER PUBLICATIONS

Extraordinary transmission of organic photoluminescence through an otherwise opaque metal layer via surface plasmon cross coupling, Gifford, et al., Applied Physics Letters, May 2002, vol. 80, No. 20.*

*Primary Examiner* — Karen Kusumakar
(74) *Attorney, Agent, or Firm* — Hartman Global IP Law; Gary M. Hartman; Domenica N.S. Hartman

(57) ABSTRACT

There is provided an organic light emitting diode (OLED) comprising an organic electroluminescent layer formed between a first electrode and a second electrode, characterized in that one of the first and second electrodes comprises a nano-meter metallic layer having a plasmonic photonic crystal structure formed thereon, and wherein the plasmonic photonic crystal structure is configured to interact with surface plasmon polaritons generated at a surface of the ne electrode thereby providing for transmission of electromagnetic radiation having a wavelength of between 350 nm to 750 nm from the OLED.

13 Claims, 5 Drawing Sheets

(56) References Cited

U.S. PATENT DOCUMENTS

| | | | |
|---|---|---|---|
| 2008/0018233 A1 | 1/2008 | Vardeny et al. | |
| 2010/0219427 A1* | 9/2010 | Fukuda | H01L 51/5265 257/89 |
| 2010/0295080 A1* | 11/2010 | Lim | H01L 33/007 257/98 |
| 2012/0181920 A1* | 7/2012 | Frischeisen | H01L 51/5262 313/504 |
| 2013/0153861 A1* | 6/2013 | Kaminska | H01L 51/441 257/40 |

* cited by examiner

ORGANIC LIGHT EMITTING DIODE STRUCTURE

This invention relates to electroluminescent devices and in particular to electroluminescent devices based on organic light emitting diodes (OLEDS).

Known organic light-emitting diodes (OLEDs) generally comprise an emissive electroluminescent organic semiconductor material layer formed between a cathode and an anode formed on a glass substrate, whereby the electroluminescent organic semiconductor material emits light when a voltage is applied across the anode and cathode electrodes.

In order for visible light to be emitted from the OLED, at least one of the electrodes must be transparent to radiation in the 350 nm-800 nm wavelength range.

OLEDs are considered to be suitable candidates for the next generation of displays e.g. flat panel displays because of their advantages over conventional technologies used in traditional displays e.g. liquid Crystal displays (LCDs) and plasma display panels (PDPs). OLEDs are also being increasingly used in lighting applications, replacing the more common incandescent bulbs.

Such advantages over LCDs and PDPs include, lower fabrication costs, light-weight, flexible plastic substrates, wider viewing angles & improved brightness, increased power efficiency and faster response time. However, whilst efficient in comparison to LCDs and PDPs, the efficiency of the OLED is limited, due to incomplete light extraction from the active, light-emitting layer due to losses in the OLED.

FIG. 1 shows in section, a conventional OLED 1 of the prior art, whereby an organic electroluminescent material layer 2 is located between two electrodes; a transparent anode 4 and a reflecting cathode 6.

The specific type of electroluminescent layer to be used may vary depending on the application of the OLED. For example, such material for the electroluminescent material may include organometallic chelates, for example $Alq_3$, fluorescent and phosphorescent dyes and conjugated dendrimers. Alternatively, organic polymer molecules may be used, whereby typical polymers include derivatives of poly (p-phenylene vinylene) and polyfluorene. Substitution of side chains onto the polymer may determine the colour of emitted light or the stability and solubility of the polymer for performance and ease of processing. Furthermore, a polymer such as poly (n-vinylcarbazole) may be used as a host material to which an organometallic complex is added as a dopant. Iridium complexes such as Ir $(mppy)_3$ or complexes based on other heavy metals such as platinum may also be used.

The anode 4 is fabricated from a transparent material (e.g. indium-tin-oxide (ITO)), whilst the cathode 6 may be fabricated from a reflective metal (e.g. magnesium-silver or lithium-aluminium alloy). A protective substrate (not shown) is then deposited over the anode 4. The substrate may be flexible. Alternatively, the anode, cathode and electroluminescent material may be deposited on the substrate.

In operation, when a voltage 10 is applied across the electrodes 4 and 6, holes from the anode 4 and electrons from the cathode 6 are injected into the organic layer 2. These holes and electrons migrate through the organic layer 2 until they meet and recombine to form an exciton. Relaxation from the excited to ground states then occurs, causing emission of light 12 through the transparent anode 4.

Furthermore, it is known to use different layers and materials to increase the efficiency of OLEDs, whereby hole and electron injection and/or blocking and/or transport layers are used to optimise the electric properties of the OLED. For example, hole injection (HIL) e.g. Cu/Pc and/or hole transport layers (HTL) e.g. aNPD, Triarylamines, and/or electron transport (ETL) e.g. Alq3 and/or Hole Blocking layers (HBL) e.g. BCP may be used to improve electrical efficiency as required. When a voltage 10 is applied between the anode and the cathode in the OLED having the above-described structure, holes generated in the anode move to the emission layer through the HIL and the HTL, and electrons generated in the cathode move to the emission layer through the HBL and the ETL. The holes and electrons moved to the emission layer are recombined in the emitting layer to emit the light. The light generated in the emission layer is emitted to the outside through the anode. Whilst the HIL, HTL, ETL, and HBL address the electrical efficiency of OLEDs, one of the key challenges in the design of OLEDs is to optimize their light extraction efficiency.

For conventional OLEDs as depicted in FIG. 1, light extraction inefficiencies exist because light generated within a high-index organic material has difficulty propagating into the surrounding lower-index Anode/Glass substrate owing to total internal refection (TIR) at the glass/air interface, coupling to dielectric waveguide modes of the organic layers, in-plane emission, and dissipation into the metal contacts of the OLED. Approximately, 30% of the generated photons remain trapped in the glass substrate and 50% in the organic layers. Therefore, output coupling efficiency of known OLEDs is approximately only 20%.

Various approaches for improving the optical out coupling efficiency of OLEDs have been put forward. For example, the planar substrate/air interface may be modified in order to reduce repeated TIR e.g. by using a micro lens array, or a large half sphere lens on the substrate surface.

Other methods of out-coupling efficiency attempt to extract the light trapped in the organic/ITO layers for example by using a low refractive index porous aerogel, micro-cavity effects, or an embedded low-index grid photonic crystal pattern on the glass substrate. However, using these methods, the improvement in relation to OLED efficiency is limited. Moreover, some of these methods have disadvantages associated with them such as a reduction in electrical efficiency, a decrease in lifetime, a viewing angle dependent colour, complicated fabrication processes and high costs. For instance, eliminating TIR using antireflective coatings does not work as each of the layers will refract the light and ultimately the final interface with air will still meet the TIR condition. In addition, establishing gratings at pitches less than half the UV exposure wavelength is very difficult.

Accordingly, it is an object of the present invention to provide an improved OLED structure which addresses the above-identified problems with conventional OLEDs.

In a first aspect there is provided an organic light emitting diode (OLED) comprising: an organic electroluminescent layer formed between a first electrode and a second electrode, characterised in that one of the first and second electrodes comprises a nano-meter metallic layer having a plasmonic photonic crystal structure formed thereon, and wherein the plasmonic photonic crystal structure is configured to interact with surface plasmon polaritons generated at a surface of the one electrode thereby providing for transmission of electromagnetic radiation having a wavelength of between 350 nm to 750 nm from the OLED.

Preferably, the plasmonic photonic crystal structure comprises periodic formations formed thereon operable to supress SPP propagation at the surface of the one electrode.

Preferably, the one electrode is an anode of the OLED.

Preferably, the formations comprise at least one grating formed on the surface of the one electrode.

Preferably, wherein the at least one grating formation comprises at least one cavity, and preferably a plurality of cavities, wherein the cavities are periodically spaced in the anode.

Preferably, wherein the cavities are non-periodically spaced in the anode.

Preferably, the shape of the cavities is isotropic or anisotropic.

Preferably, the pitch P between the grating formations is between 100 nm to 500 nm, and preferably between 200 nm and 320 nm.

Preferably, the width W of the cavities is between 50 nm and 250 nm, and preferably between 100 nm and 150 nm.

Preferably, the depth $d_1$ of the cavities is between 1 nm and 50 nm, and preferably between 5 nm and 20 nm.

Preferably, the anode is a silver layer.

Preferably, the depth $d_A$ of the anode is between 50 and 200 nm, and preferably between 90 and 110 nm.

Preferably, the OLED further comprises at least one of an HIL, HTL, ETL and/or HBL.

In a second aspect there is provided an electronic device incorporating an OLED as claimed in any preceding claim.

Figure 1:
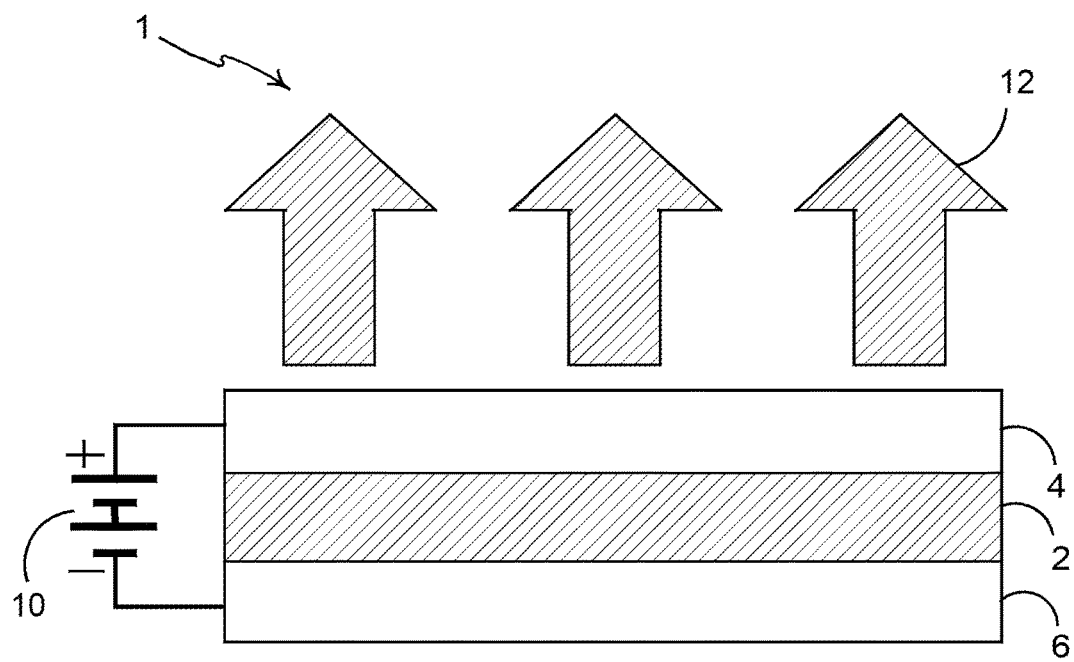
FIG. 1 shows in section, a conventional OLED of the prior art.
Figure 4:
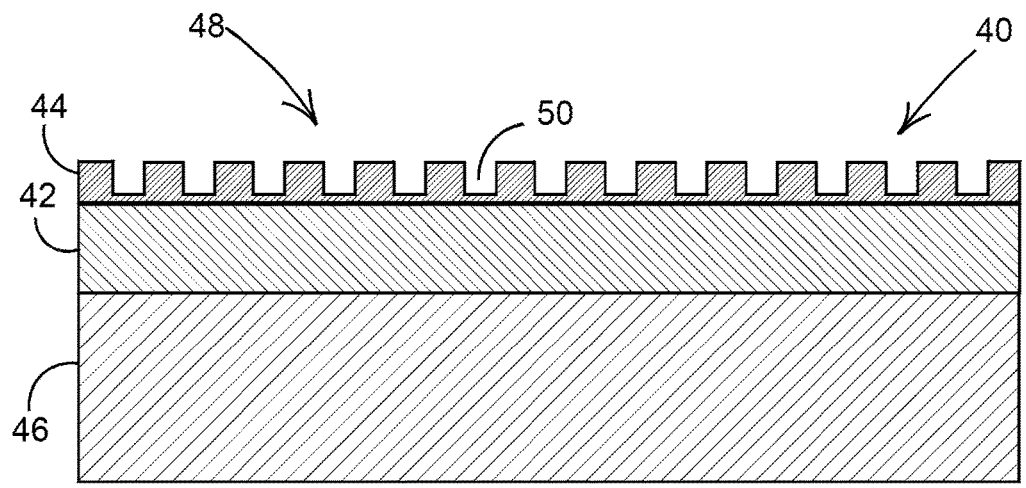
FIG. 4 shows in section, an OLED according to a second embodiment the present invention having a grating formation formed in an electrode of the OLED.
Figure 7:
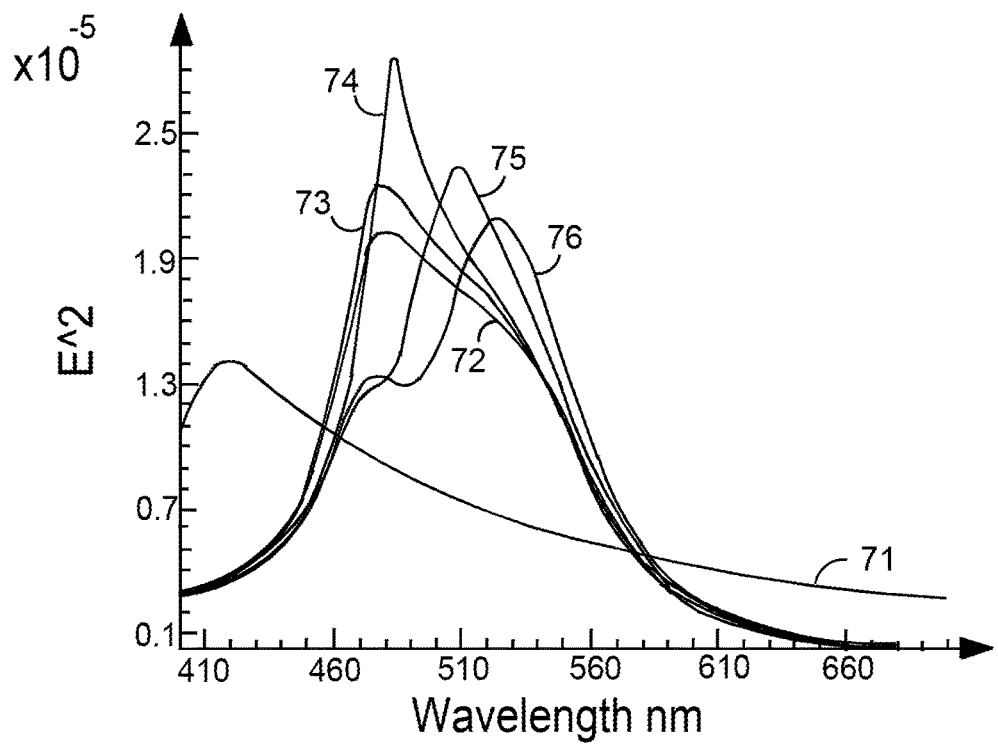
Figure 8:
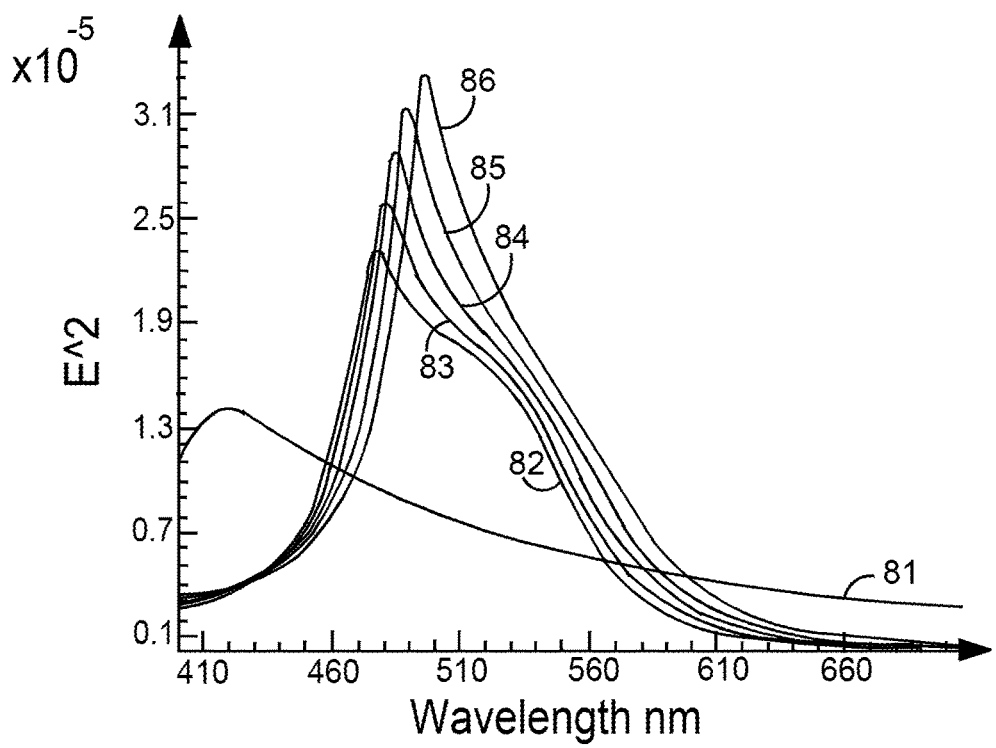

FIG. 7 shows a graphical representation of the calculated emission properties (output average electric field ($E^2$) versus wavelength (nm)) of the OLED of FIG. 4, having different grating periods, in comparison to the OLED of FIG. 1; and FIG. 8 shows a graphical representation of the calculated emission properties (output average electric field ($E^2$) versus wavelength (nm)) of the OLED of FIG. 4, having different grating depths, in comparison to the OLED of FIG. 1.

Figure 2:
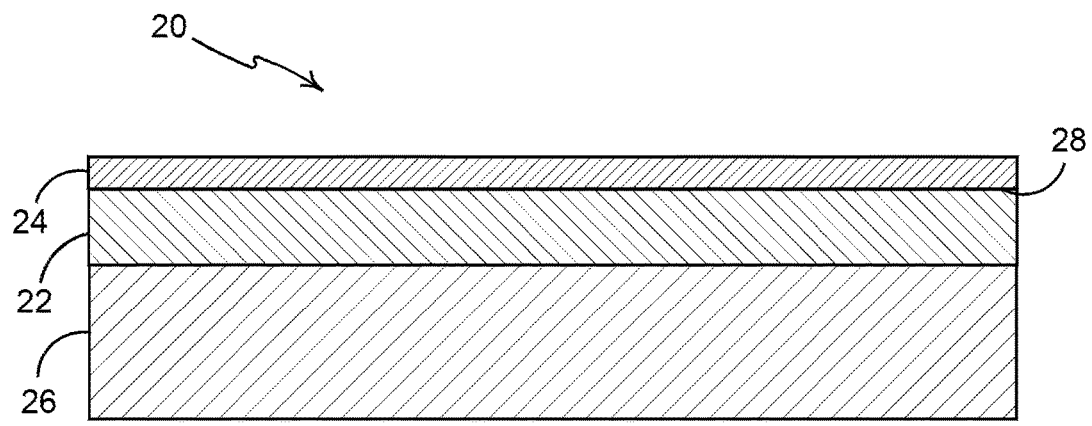
FIG. 2 shows in section, an OLED according to a first embodiment of the present invention.

FIG. 2 shows in section, an OLED 20 according to a first embodiment of the present invention, whereby an organic electroluminescent material layer 22 is located between two electrodes; an anode 24 and a reflecting cathode 26. As detailed above HIL, HTL, ETL and/or an HBL layer could also be used in the OLED 20 to improve electrical efficiency as required.

The anode 24 is fabricated as a plasmonic metallic photonic crystal (PC) layer. In this case, the PC layer is a 1-100 nm silver (Ag) layer, but the PC layer may be fabricated of any suitable material as will become apparent to a skilled person having read this specification e.g. aluminium (Al), gold (Au) etc. As above the cathode 26 may be fabricated from any suitable material (e.g. magnesium-silver or lithium-aluminium alloy).

It is known that metals conduct electricity because electrons in the metal are generally free to propagate therein, thereby transporting electric charge through the metal.

It is generally accepted that all forms of energy and matter have wavelike properties, and that such waves interact with a medium of periodically varying density. Depending on the spatial period or pitch of this density variation, the medium can be transparent to the energy or matter waves, whilst it is also possible that at some pitches of density oscillation it becomes impossible for the energy or matter waves to sustain themselves in the medium.

For example, electrons have characteristic wavelength ($\lambda$) which varies with electron energy. As above, electrons can interact with matter with a cyclically and periodically varying density. In fact, in crystalline materials the spacing of the atoms or molecules is in the range where the crystalline materials interact with electrons so as to either be transparent to them or so as to interact such that the electron waves cannot be sustained. Metals are crystalline conductors in which the spatial period of the metal atoms in the crystal lattice is such that the metal allows propagation of electron waves (metallic crystal).

Photons also have a characteristic wavelength ($\lambda$), which varies with photon energy, and photonic crystals can be fabricated with a spatial periodicity such that photons can propagate through the crystal, or such that photons are prevented from propagation there-though, by means of a photonic bandgap i.e. a frequency window in which propagation of the photons of a particular frequency is prevented. The band of pitches at which light propagation is not sustained is centered on half the wavelength ($\lambda$) of the photons impinging on the medium.

If an electromagnetic light wave interacts with a metal, such an interaction sets up an oscillation of the electrons in the metal, which is in resonance with the frequency of the oscillation of the electric field in the electromagnetic light wave. The oscillations in metals can be localised and behave as if they are particles. These particle-like entities produced by interaction with electromagnetic light waves, are known as plasmons, and collectively oscillate at the surfaces of metals at optical frequencies.

Plasmons at an interface between a metal and a dielectric material e.g. organic material used in OLEDs, have lower energy than those in the bulk of the metal. Having lower energy means the surface plasmons will have a lower frequency of oscillation and a longer wavelength ($\lambda$).

Since surface plasmons have longer wavelengths ($\lambda$) than electrons in the metal, but shorter wavelengths than the interacting photons, artificial lattices can be fabricated in the metal, which will interact with the plasmons (plasmonic photonic crystal), and which are intermediate in pitch of density variation in comparison to those of metallic crystals or photonic crystals.

Photons may be combined with the plasmons generated at the surface of a metal to form a particle-like entity called a surface plasmon polariton (SPP).

Similar to photons, electrons and plasmons, SPPs have a characteristic wavelength ($\lambda$), and propagate, in plane, at the interface between a metal layer and an insulating dielectric medium layer, and disintegrate into a photon(s) and electron(s) e.g. on encountering a material boundary.

A lattice may be fabricated in the metal surface, once again intermediate in size between the lattices of a metallic crystal and a photonic crystal, that renders it impossible for SPPs to be sustained in the metal surface, whilst lattices can also be fabricated which do not support SPPs, whereby the SPPs will disintegrate immediately.

In operation of the OLED 20, when a voltage (not shown) is applied across the electrodes 24, 26 electromagnetic radiation in the form of an electromagnetic light wave is generated in the light emitting material 22. The radiation interacts with the nano-meter silver anode 24. The radiation sets up an oscillation of the electrons at the interface 28 which is in resonance with the frequency of the oscillation of the electric field in the radiation i.e. plasmons.

As the electromagnetic light waves of the light emitting material 22 penetrate the metal surface of the anode 24 they are subsequently efficiently converted to SPPs. OLED emitter layers are very thin (<50 nm), such that they can be considered to be 2-dimensional (2-D), which, in practice, means that substantially all the material of the anode 24 is such that it forms the surface of the anode 24 at the interface 28. The electromagnetic radiation from the emitter layer 22 sets up an oscillation of the electrons in the anode 24 which is in resonance with the frequency of the oscillation of the electric field in the electromagnetic light wave, whereby substantially all of the in-plane light from the emitter layer 22 is converted into SPPs.

Therefore, a plasmonic crystalline lattice in the anode 24 provides a bandgap functionality in the frequency range of the SPPs, which prevents SPP generation to be supported in-plane and thus prevents in-plane light emission, which in turn provides for a substantial increase in light output from anode 24.

Therefore, the silver layer acts not only as an anode 24 to allow a voltage to be applied between the electrodes 24, 26, but is operable to excite surface plasmon polaritons SPPs to provide increased transmission of light from the OLED 20 through its anode 24.

The electromagnetic field is bounded along the interface 28 and decreases exponentially in the direction perpendicular to the interface 28, which can thereby result in a subwavelength confinement of the electromagnetic modes.

Figure 3A:
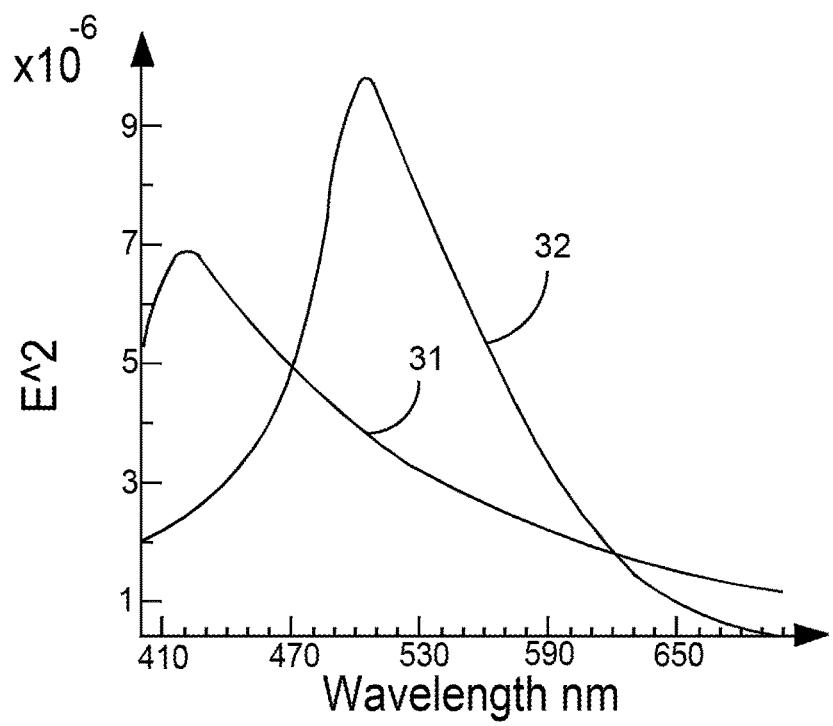
FIG. 3a shows a graphical representation of the calculated emission properties (output average electric field ($E^2$) versus wavelength (nm)) of the OLED of FIG. 2 in comparison to the OLED of FIG. 1.
Figure 3B:
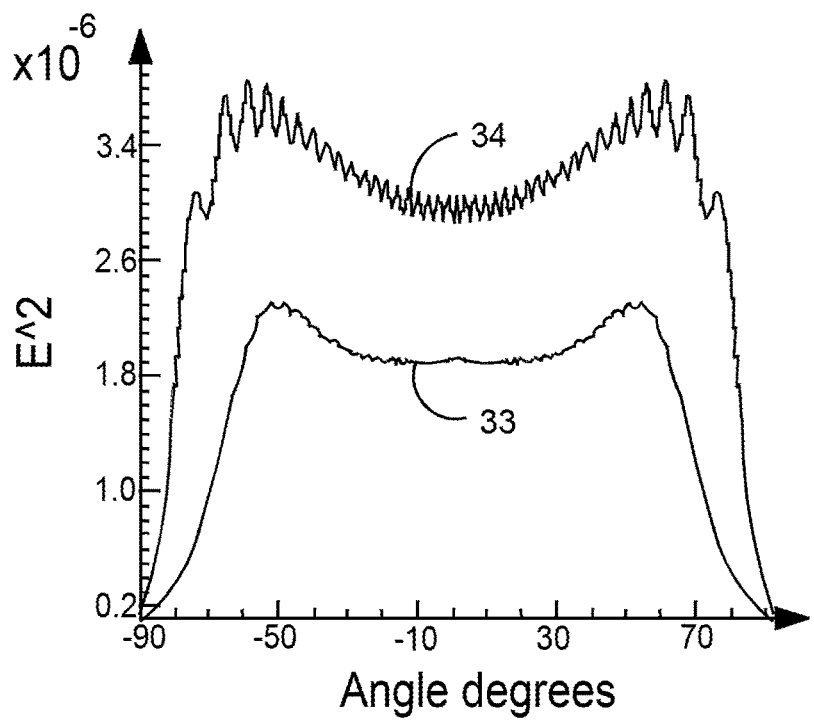
FIG. 3b shows a graphical representation of the calculated emission properties (calculated output average electric field ($E^2$) versus emission angle (degrees) of the OLED of FIG. 1 in comparison to the OLED of FIG. 2.

FIG. 3a shows a graphical representation of the calculated emission properties (output average electric field ($E^2$) versus wavelength (nm)) of the OLED 1, which has an ITO/glass anode as represented by trace 31 in comparison to the OLED 20 having a silver layer anode 24 with a plasmonic photonic crystal as represented by trace 32 obtained by Finite-difference time-domain (FDTD) method; whilst FIG. 3b shows a graphical representation of the calculated emission properties (output average electric field ($E^2$) versus emission angles (degrees) of the OLED 1 as represented by trace 33 in comparison to the OLED 20 as represented by trace 34, also obtained by FDTD.

In FIG. 3a it is evident from a comparison of the traces 31 and 32 that light enhancement of an OLED 20 comprising the thin silver layer having a plasmonic photonic crystal is doubled in comparison to the conventional OLED 1 at a wavelength of approximately 500 nm.

It also is evident from a comparison of the traces 33 and 34 that both larger radiation and broader angle responses are obtained for the OLED 20 comprising the thin silver layer having a plasmonic photonic crystal.

The physical origin of the enhancement arises from the excitation of SPPs at the organic and silver layer interface 28, and avoids the total internal refection which traps the light in the conventional OLED structures as waveguide mode, thereby avoiding in-plane emission of the generated photons.

The depth for the cathode 26 ($d_C$), organic layer 22 ($d_O$) and anode 24 ($d_A$) are 100 nm, 100 nm, and 15 nm, respectively, although it will be appreciated that different depths could alternatively be used.

FIG. 4 shows in section, an OLED 40 according to a second embodiment of the present invention, whereby an organic electroluminescent material layer 42 is located between two electrodes; an anode 44 and a reflecting cathode 46. As detailed above HIL, HTL, ETL and/or HBL could also be used in the OLED 40 to improve electrical efficiency as required.

The anode 44 is fabricated as a plasmonic metallic photonic crystal (PC) layer. In the present embodiment the PC layer is a silver (Ag) layer with depth $d_A$ having at least one grating formation 48 comprising a regularly repeating periodic structure formed therein.

Although fabricated of evaporated silver in the present embodiment, the anode 44 may be fabricated of any suitable material using any suitable technique as will become apparent to a skilled person having read this specification e.g. gold (Au), aluminium (Al) etc. Furthermore, the cathode 46 may be fabricated from any suitable material (e.g. magnesium-silver or lithium-aluminium alloy).

The grating formations 48 further enhance the functionality of the OLED 40 in comparison to the OLEDs 1 and 20, by taking advantage of extraordinary optical transmission (EOT), which is the phenomenon of greatly enhanced transmission of light through a normally opaque metallic layer, through the use of a repeating periodic structures, formed thereon such as grating formations e.g. cavities.

Figure 5:
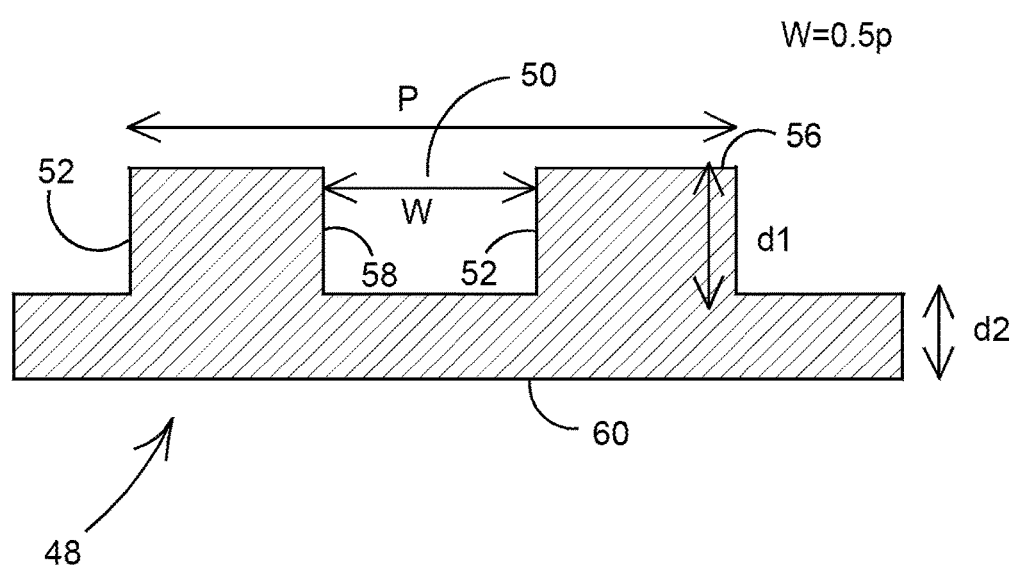
FIG. 5 shows in section the electrode of the OLED FIG. 4.

FIG. 5 shows, in section, the anode 44 having the grating formation 48 formed thereon. As shown in greater detail in FIG. 5, each grating formation 48 comprises a cavity 50, having a width W and depth $d_1$, and having a sidewall 52, whereby the cavity 50 has a depth $d_1$ which is the distance from the top surface 56 of the anode 44 to the bottom surface 58 of the cavity.

Depth $d_2$ is the depth from the bottom surface 58 of the cavity 50 to the bottom surface 60 of the anode 44, whereby $d_2 \sim d_A - d_1$. The pitch P of each formation 48 is defined as the distance between each grating formation 48.

Depending on the application, the formations 48 may be formed as periodic or non-periodic cavities on the surface of the anode, wherein, for the present embodiment:

W=0.5P,
Whereby P ranges from 1 nm to 500 nm,
$d_1$ ranges from 0.5 to 100 nm;
$d_2 \sim d_1$;
$d_A \sim d_1 + d_2$; and
wherein $d_a > d_1$.

The grating formations 48 in the present embodiment of the invention are formed as periodic cavities 50 having features smaller than the wavelength of the SPPs generated at the surface of the interface between the anode 44 and organic layer 42, wherein P~200 nm to 300 nm;
W~0.25 to 50 nm
$d_1 \sim d_2 \sim 10$ nm;
$d_A \sim 20$ nm, and
wherein $d_a > d_1$.

The grating formations 48 may be formed as isotropic or anisotropic cavities, and may take any shape e.g. cylindrical, conical, pyramidal etc.

In the present embodiment, the plasmonic photonic crystal formations 48 are produced using reactive ion etching. However, any suitable nano- and/or micro-machining technique such as a plasma etching, evaporation, lithography, laser lithography, ion beam lithography, electron beam lithography, nano-imprinlithography, inkjet printing, chemical etching etc.

Figure 6A:
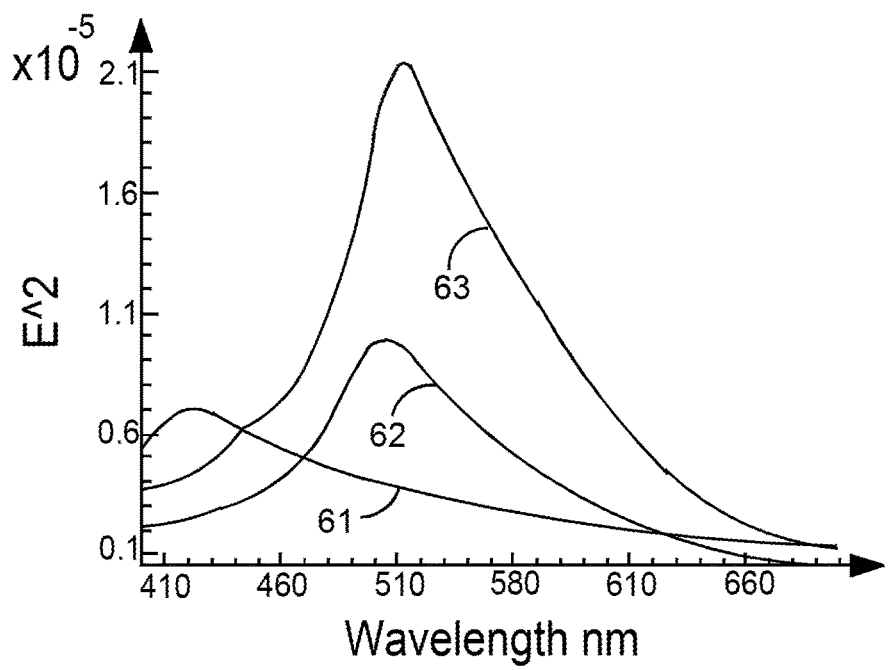
FIG. 6a shows a graphical representation of the calculated emission properties (output average electric field ($E^2$) versus wavelength (nm)) of the OLED of FIG. 4 in comparison to the OLEDs of FIGS. 1 and 2.
Figure 6B:
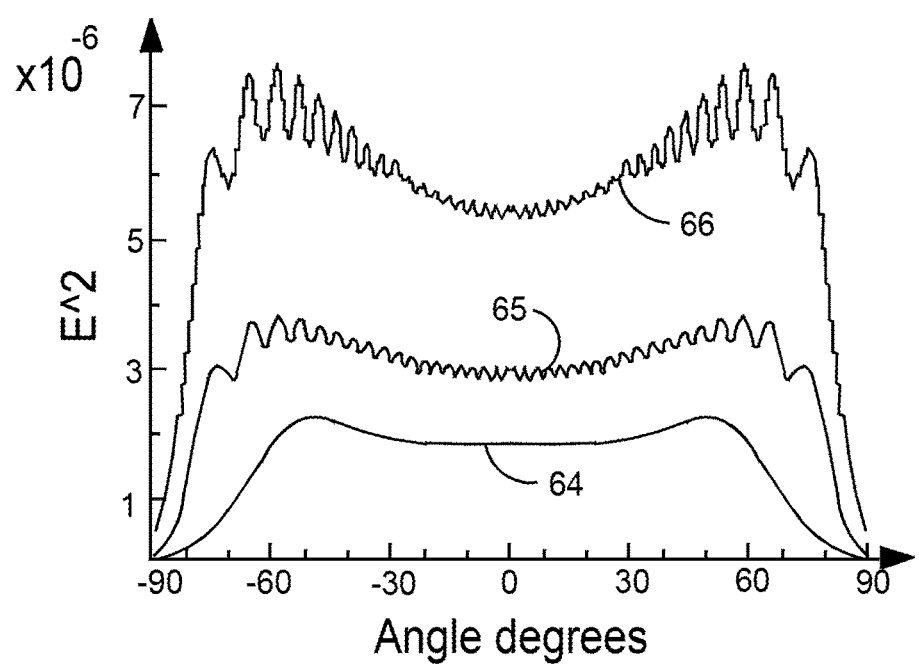
FIG. 6b shows a graphical representation of the calculated emission properties (output average electric field ($E^2$) versus emission angle (degrees)) of the OLED of FIG. 4 in comparison to the OLEDs of FIGS. 1 and 2.

FIG. 6a shows a graphical representation of the calculated output average electric field ($E^2$) versus wavelength (nm) of the OLEDs 1 and 20 as represented by traces 61 and 62 respectively in comparison to the OLED 40 as represented by trace 63 and obtained by FDTD; whilst FIG. 6b shows a graphical representation calculated output average electric field ($E^2$) versus emission angles (degrees) of the OLED 1 and 20 as represented by traces 64 and 65 respectively, in comparison to the OLED 40 as represented by trace 66, also obtained by FDTD.

In FIG. 6a it is evident from a comparison of the traces 61, 62 and 63 that light enhancement of an OLED 20 comprising the nano-meter silver layer is doubled in comparison to the conventional OLED 1 at a wavelength of 500 nm, whilst light enhancement of an OLED 40 comprising the nano-meter silver layer having the cavity structures structure formed therein is approximately 5× greater in comparison to the conventional OLED 1 at a wavelength of 500 nm, and >2× greater in comparison to the OLED 20.

It also is evident from a comparison of traces 64, 65 and 66 that both larger radiation and broader angle responses are obtained for the OLED 40 in comparison to the OLEDs 1 and 20 as a result of the anode 44 having a plasmonic photonic crystal formed.

FIG. 7 shows a graphical representation of the calculated emission properties (output average electric field ($E^2$) versus wavelength (nm)) of the OLED 40, having different grating periods P between 200 nm (trace 72), 220 nm (trace 73), 240 nm (trace 74), 280 nm (trace 75), and 320 nm (trace 76), in comparison to the conventional OLED 1 as represented by trace 71, and obtained by FDTD.

For FIG. 7 the OLED 40 has the following features:
W=0.5P and
$d_1 \sim d_2 \sim 10$ nm It will be seen that increasing the grating periods P between 200 nm and 320 nm, provides greater light enhancement in comparison to the conventional OLED 1. It will also be seen from FIG. 7 that a grating period P~240 nm provides the greatest light enhancement, which occurs at 485 nm, as depicted by the trace 74.

FIG. 8 shows a graphical representation of the calculated emission properties (output average electric field ($E^2$) versus wavelength (nm)) of the OLED 40 in comparison to the OLED 1, obtained by FDTD, with the OLED 40 having different grating depths $d_1$.

For FIG. 8, the OLED 40 has the following features:
P=200 nm
W=0.5P and
$d_1+d_2=20$ nm It will be seen that increasing the grating depth $d_1$ from 6 nm (trace 82), 8 nm (trace 83), 10 nm (trace 84), 12 nm (trace 85) to 14 nm (trace 86), provides greater light enhancement in comparison to the conventional OLED 1 as represented by trace (81), and further redshifts the peak wavelength to a higher value wavelength.

Advantageously, the OLEDs 20 and 40 having a metallic photonic crystal layer as an electrode significantly enhances light extraction from an OLED 20, 40 in comparison to conventional OLEDs by reducing absorption losses within the OLED, and through extraordinary optical transmission.

Furthermore, using a metallic layer having the photonic crystal means that the photonic crystal can be used as an electrode, for example an anode, without the requirement for additional unnecessary electrode layers, thereby decreasing the form factor of the OLED.

Such an OLED 20, 40 could be incorporated into an electronic device, for example flat panel lighting devices and displays.

The invention claimed is:

1. An organic light emitting diode (OLED) comprising:
an organic electroluminescent layer formed between a first electrode and a second electrode, characterised in that one of the first and second electrodes is a transparent electrode having a surface through which light is emitted from the OLED to the outside, the one electrode comprising a nano-meter metallic layer having a plasmonic photonic crystal structure, and wherein the plasmonic photonic crystal structure is configured having a bandgap in the frequency range of surface plasmon polaritons generated at the surface of the one electrode, thereby operable to suppress propagation of the surface plasmon polaritons at the surface, and so provide for transmission of electromagnetic radiation having a wavelength of between 350 nm to 750 nm from the OLED, at least one grating formation formed on the surface of only the one electrode, and wherein the at least one grating formation comprises a plurality of cavities.

2. An OLED as claimed in claim 1, wherein the one electrode is an anode of the OLED.

3. An OLED as claimed in claim 1, wherein the depth $d_1$ of each of the plurality of cavities is between 5 nm and 20 nm.

4. An OLED as claimed in claim 1, wherein the plurality of cavities are periodically spaced.

5. An OLED as claimed in claim 1, wherein the plurality of cavities are non-periodically spaced.

6. An OLED as claimed in claim 1, wherein the shape of each of the plurality of cavities is isotropic or anisotropic.

7. An OLED as claimed in claim 1, wherein the pitch P between the grating formations is between 100 nm to 500 nm.

8. An OLED as claimed in claim 1, wherein the width W of each of the plurality of cavities is between 50 nm and 250 nm.

9. An OLED as claimed in claim 1, wherein the depth $d_1$ of each of the plurality of cavities is between 1 nm and 50 nm.

10. An OLED as claimed in claim 2, wherein the anode is a silver layer.

11. An OLED as claimed in claim 2, wherein the depth $d_A$ of the anode is between 50 and 200 nm.

12. An OLED as claimed in claim 1, wherein the OLED further comprises at least one of an HIL, HTL, ETL and/or HBL.

13. An electronic device incorporating an OLED as claimed in claim 1.

* * * * *